(12) United States Patent
Kim et al.

(10) Patent No.: US 8,173,454 B2
(45) Date of Patent: May 8, 2012

(54) LIGHT EMITTING DIODE PACKAGE AND METHOD OF MANUFACTURING THE SAME

(75) Inventors: Hyung Tae Kim, Gwangju (KR); Yong Hun Choi, Gwangju (KR); Nag Jong Choi, Gwangju (KR)

(73) Assignee: Intops LED Co., Ltd., Gwangju (KR)

( * ) Notice: Subject to any disclaimer, the term of this patent is extended or adjusted under 35 U.S.C. 154(b) by 233 days.

(21) Appl. No.: 12/691,599

(22) Filed: Jan. 21, 2010

(65) Prior Publication Data

US 2011/0140143 A1 Jun. 16, 2011

(30) Foreign Application Priority Data

Dec. 16, 2009 (KR) ................. 10-2009-0125204

(51) Int. Cl.
*H01L 23/495* (2006.01)
(52) U.S. Cl. .......... 438/26; 438/111; 438/122; 438/123; 257/E21.51; 257/E23.033; 257/E23.049
(58) Field of Classification Search .............. 438/26, 438/111, 122, 123; 257/E21.51, E23.033, 257/E23.049
See application file for complete search history.

(56) References Cited

U.S. PATENT DOCUMENTS

| 7,256,468 B2 * | 8/2007 | Suenaga | 257/434 |
| 2004/0120155 A1 * | 6/2004 | Suenaga | 362/362 |
| 2005/0179364 A1 * | 8/2005 | Murazaki | 313/498 |
| 2008/0315235 A1 * | 12/2008 | Murazaki | 257/98 |

FOREIGN PATENT DOCUMENTS

KR 10-2009-0125204 12/2009
* cited by examiner

*Primary Examiner* — George Fourson, III
(74) *Attorney, Agent, or Firm* — IPLA P.A.; James E. Bame

(57) ABSTRACT

Disclosed is a light emitting diode package, including a metal body including a cavity for receiving a light emitting diode therein, a lens mount for mounting thereon a lens through which light is transmitted, a heat sink for dissipating heat, a lead insertion recess formed on a bottom surface of the metal body so that a lead is inserted therein, and a bonding hole formed to communicate with the lead insertion recess and passing through the cavity of the metal body; and a lead seated into the lead insertion recess of the metal body and insulation bonded to the bottom surface of the metal body by means of an insulating binder, so that an insulation type bonding relationship between the metal body and the lead is maintained stable. A method of manufacturing the light emitting diode package is also provided.

4 Claims, 7 Drawing Sheets

US 8,173,454 B2

LIGHT EMITTING DIODE PACKAGE AND METHOD OF MANUFACTURING THE SAME

CROSS REFERENCE

This application claims foreign priority under Paris Convention and 35 U.S.C. §119 to Korean Patent Application No. 10-2009-0125204, filed Dec. 16, 2009 with the Korean Intellectual Property Office.

BACKGROUND OF THE INVENTION

1. Technical Field

The present invention relates to a light emitting diode (LED) package in which an insulation type bonding relationship between a metal body and a lead is maintained stable, and to a method of manufacturing the same.

2. Description of the Related Art

These days, an LED which typically generates light using electroluminescence caused by applying voltage to a semiconductor is widely used as a backlight unit of a liquid crystal display. Such an LED is an opto-electronic transducer type semiconductor device having a junction structure between p-type and n-type semiconductor crystals, and is utilized as a light source device for a variety of displays because it converts electrical signals into light. Furthermore, because the LED is a compound semiconductor resulting from compounding a group III element (Al, Ga, In) with a group V element (As, P, N, Sb) in the periodic table, the wavelength of light varies depending on the kind of material thereof. Also, the efficiency of light generation of the LED is determined by the reflection structure of the package, and reliability thereof is determined by the ability to dissipate heat from a lead frame structure including the package.

In this regard, Korean Patent No. 10-0902357 (publication date: Jun. 12, 2009) discloses an LED package and a method of manufacturing the same, in which the LED package includes a lead frame, a metal housing and an insulating member in which the lead frame and the metal housing are bonded to each other by inserting a bonding portion of the lead frame into a bonding portion insertion hole of the metal housing and then performing fusion bonding using the insulating member therebetween. Furthermore, in order to maintain the insulation type bonding relationship between the lead frame and the metal housing, a lead insertion hole is formed in the bottom of the metal housing so that the lead of the lead frame is spaced apart from the inner wall of the insertion hole of the metal housing with a gap disposed around the lead.

However, such an LED package is problematic because the insulation type bonding relationship between the lead and the metal housing is maintained due to the gap disposed therebetween, undesirably causing a short between the lead and the metal housing after external impact.

SUMMARY OF THE INVENTION

Accordingly, the present invention has been made keeping in mind the problems encountered in the related art and the present invention is intended to provide an LED package in which an insulation type bonding relationship between a lead frame and a metal body is maintained stable, and a method of manufacturing the same.

An aspect of the present invention provides an LED package, including a metal body composed of a cavity for receiving an LED therein, a lens mount for mounting thereon a lens through which light is transmitted, a heat sink for dissipating heat, a lead insertion recess formed on a bottom surface of the metal body so that a lead can be inserted therein, and a bonding hole formed to communicate with the lead insertion recess and passing through the cavity of the metal body; and a lead seated into the lead insertion recess of the metal body and insulation bonded to the bottom surface of the metal body by means of an insulating binder.

In this aspect, the LED package may further include an LED bonded to the cavity of the metal body and wire bonded to the lead exposed via the bonding hole so as to form an electrical connection therebetween; and a lens mounted on the lens mount of the metal body so as to hermetically seal the cavity of the metal body.

In this aspect, an upper portion of the bonding hole of the metal body may be formed to be inclined in order to prevent wiring from making contact upon wire bonding.

In this aspect, a wire bonded portion between the LED and the lead may be molded with an insulating material, and furthermore, the LED may be molded with an insulating material containing a phosphor.

In this aspect, a holding hole may be formed on the bottom surface of the metal body so that a holding pin of the lead frame is fitted therein.

In this aspect, the lead may include a protrusion which is inserted into the bonding hole of the metal body and may further include an insulating member provided around the protrusion of the lead and inserted into the bonding hole of the metal body, so that the protrusion of the lead is fusion bonded to the metal body by means of the insulating member and the LED is wire bonded to the protrusion thus forming an electrical connection therebetween.

Another aspect of the present invention provides a method of manufacturing an LED package, including manufacturing a metal body composed of a cavity for receiving an LED therein, a lens mount for mounting thereon a lens through which light is transmitted, a heat sink for dissipating heat, a lead insertion recess formed on a bottom surface of the metal body so that a lead is inserted therein, and a bonding hole formed to communicate with the lead insertion recess and passing through the cavity of the metal body, and manufacturing a lead frame comprising a lead seated into the lead insertion recess of the metal body and insulation bonded to the bottom surface of the metal body by means of an insulating binder; insulation bonding the lead of the lead frame to the lead insertion recess of the metal body by means of the insulating binder, thus mounting the metal body to the lead frame; and electroplating the lead frame and the metal body which are insulation bonded to each other.

In this aspect, the method may further include, after electroplating, bonding the LED to the cavity of the metal body and wire bonding the LED to the lead via the bonding hole so as to form an electrical connection therebetween, thus mounting the LED; and mounting the lens on the lens mount of the metal body so as to hermetically seal the cavity of the metal body.

In this aspect, the method may further include molding a wire bonded portion between the LED and the lead using an insulating material, between mounting the LED and mounting the lens.

In this aspect, molding may further include molding the LED using an insulating material containing a phosphor.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Hereinafter, embodiments of the present invention will be described in detail while referring to the accompanying drawings. Moreover, descriptions of known techniques, even if they are pertinent to the present invention, are regarded as unnecessary and may be omitted in so far as they would make the characteristics of the invention and the description unclear.

Figure 1:
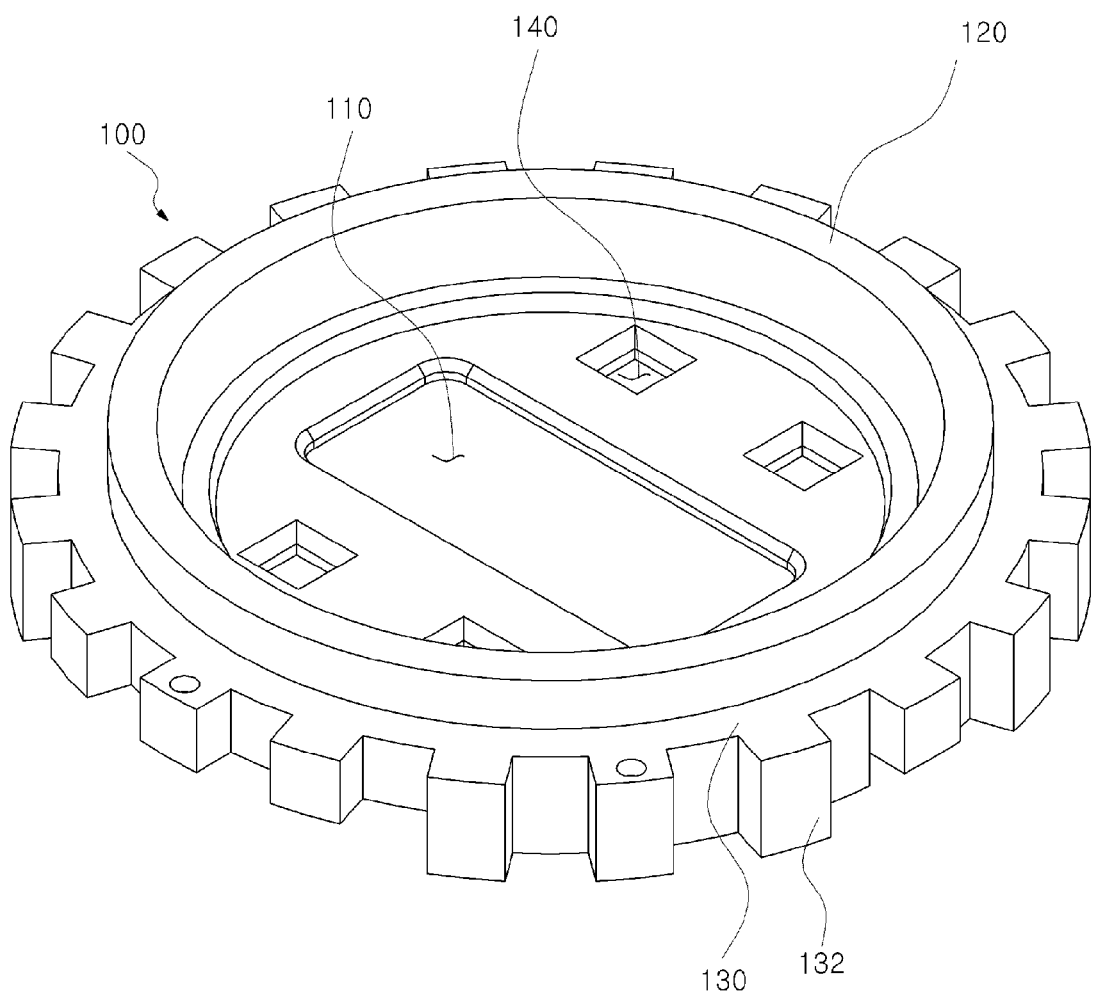
FIG. 1 is a top perspective view showing a metal body according to an embodiment of the present invention.
Figure 2:
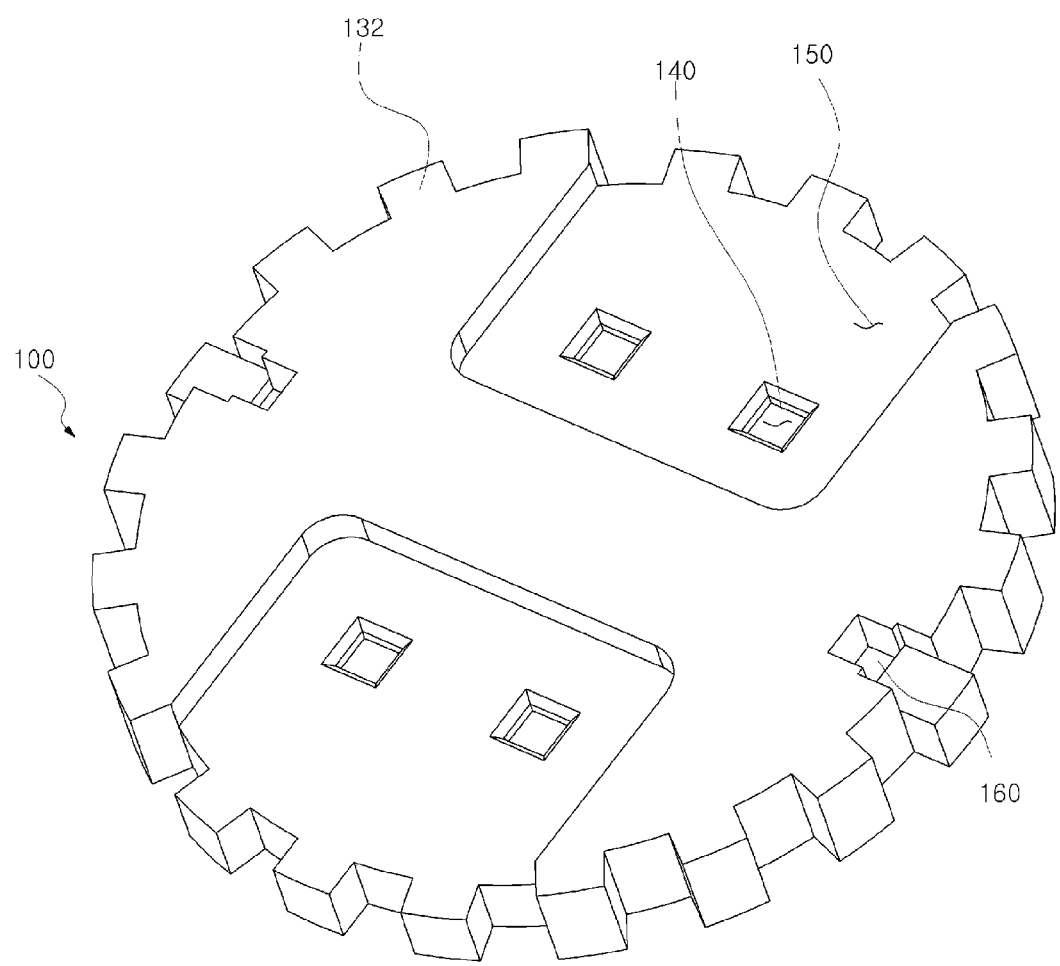
FIG. 2 is a bottom perspective view showing the metal body according to the embodiment of the present invention.
Figure 3:
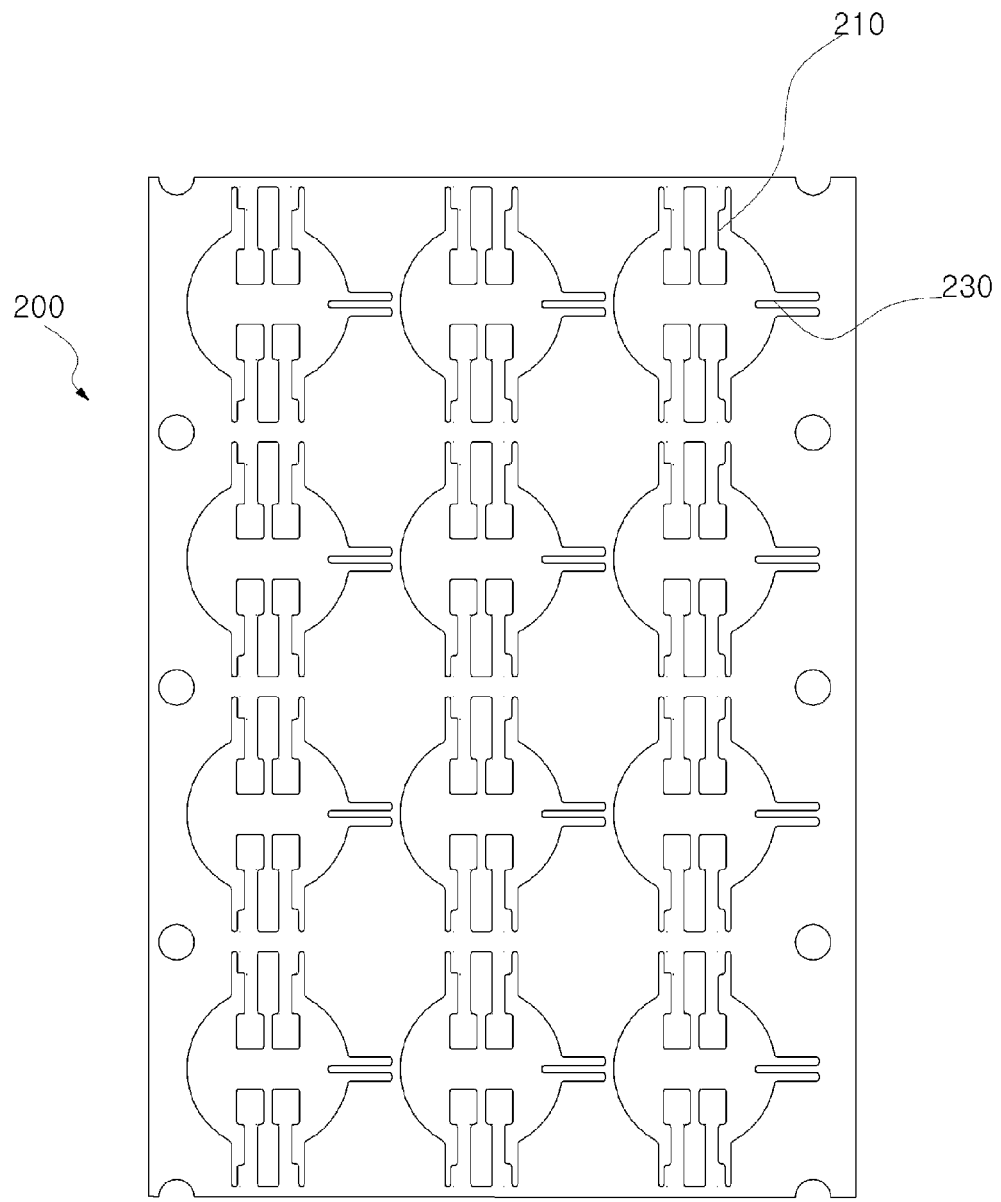
FIG. 3 is a view showing a lead frame according to the embodiment of the present invention.
Figure 4:
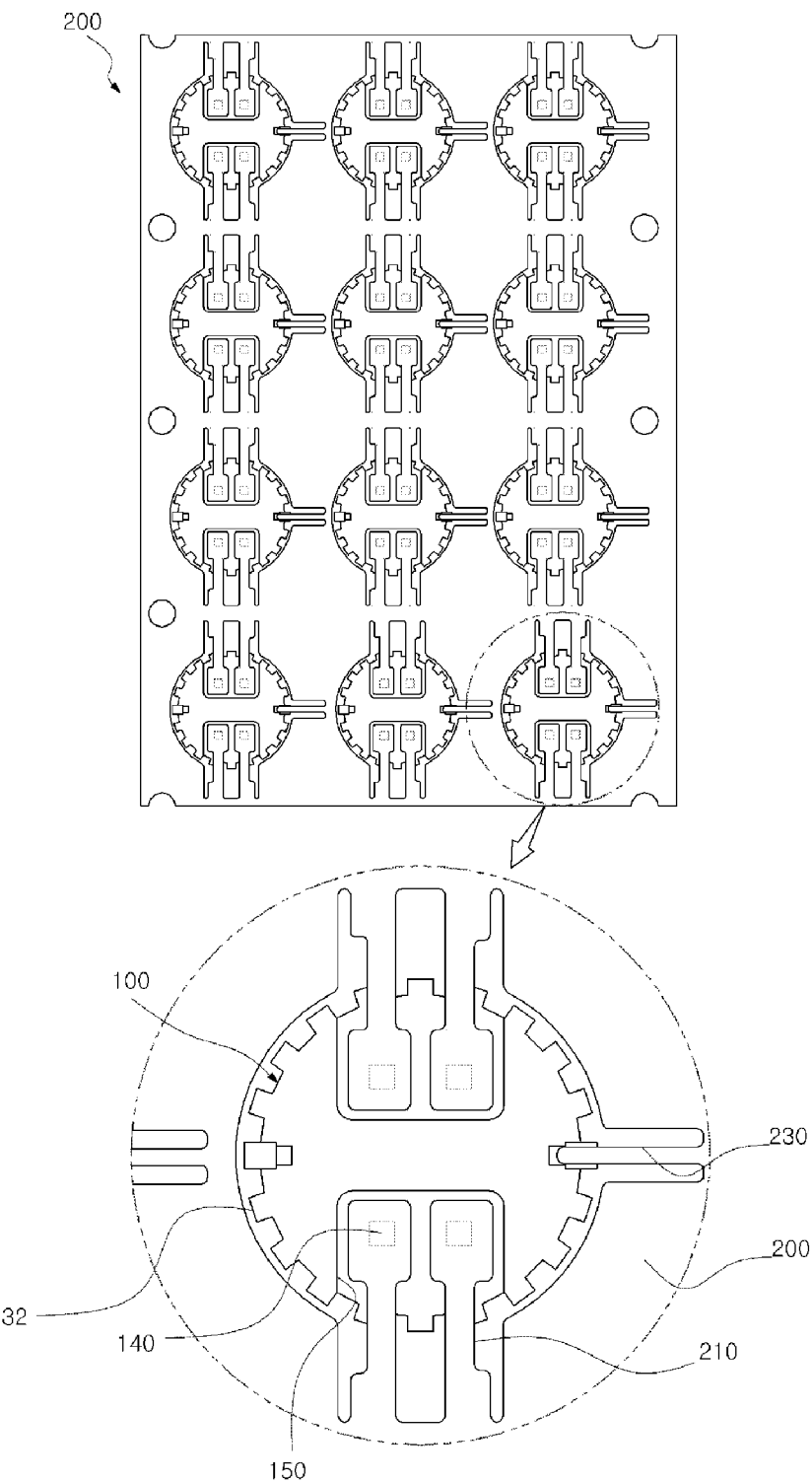
FIG. 4 is a view showing the metal body and the lead frame which are bonded to each other according to the embodiment of the present invention.
Figure 5:
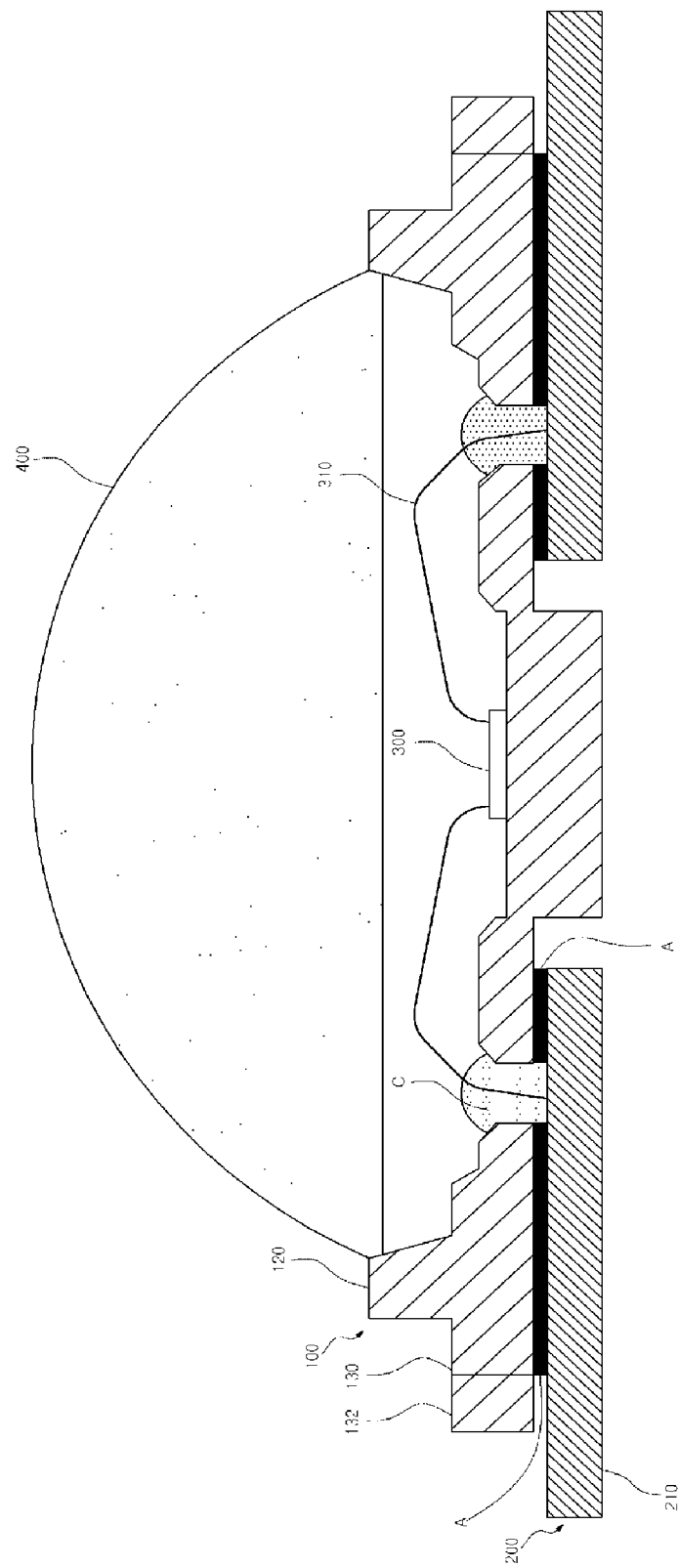
FIG. 5 is a view showing an LED package according to an embodiment of the present invention.
Figure 6:
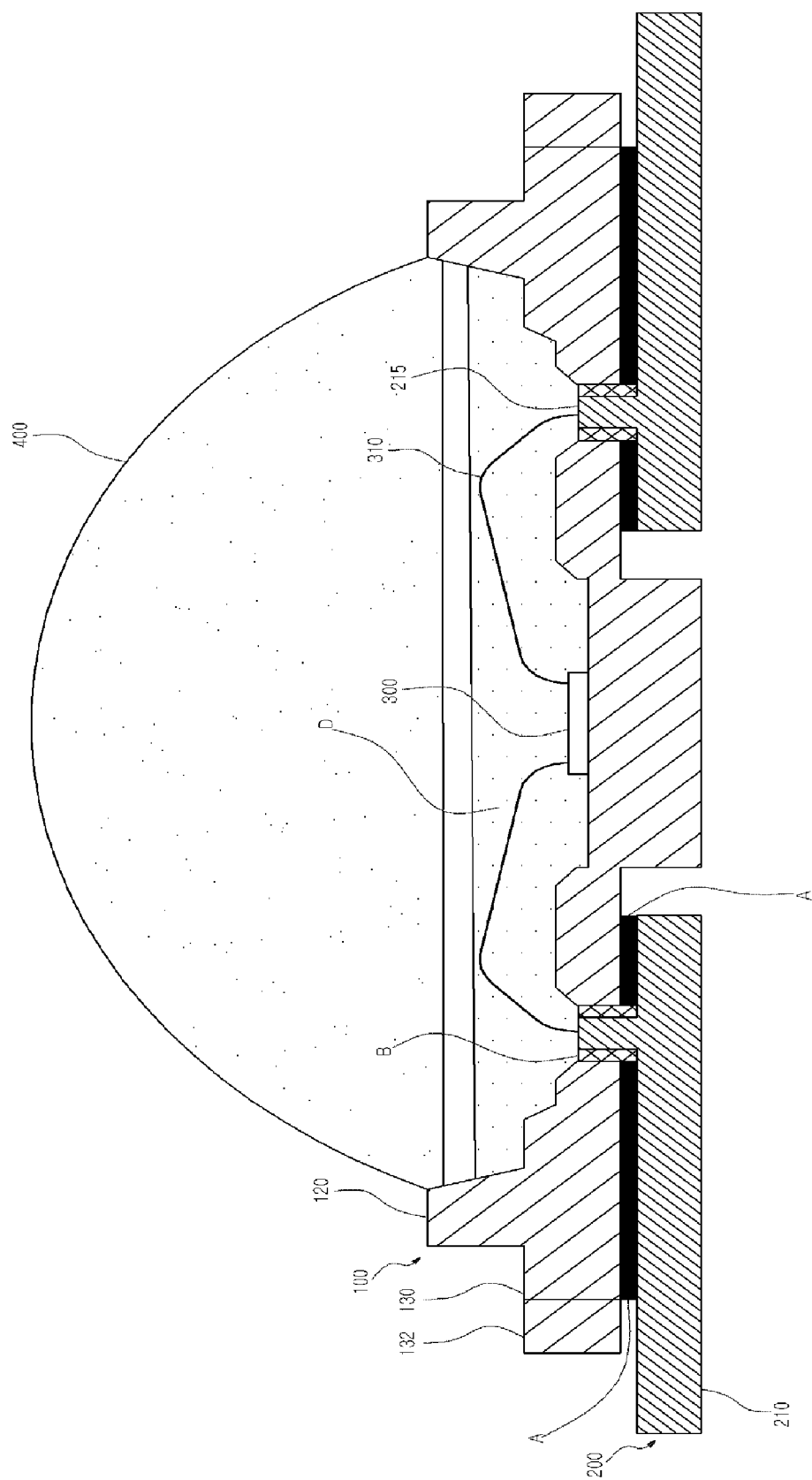
FIG. 6 is a view showing an LED package according to another embodiment of the present invention.

FIG. 1 is a top perspective view showing a metal body according to an embodiment of the present invention, FIG. 2 is a bottom perspective view showing the metal body according to the embodiment of the present invention, FIG. 3 is a view showing a lead frame according to the embodiment of the present invention, FIG. 4 is a view showing the metal body and the lead frame which are bonded to each other according to the embodiment of the present invention, FIG. 5 is a view showing an LED package according to an embodiment of the present invention, and FIG. 6 is a view showing an LED package according to another embodiment of the present invention.

As shown in FIGS. 1 to 6, the LED package according to the present invention includes a metal body 100 including a cavity 110 for receiving an LED 300 therein, a lens mount 120 for mounting thereon a lens 400 through which light is transmitted, a heat sink 130 for dissipating heat, lead insertion recesses 150 formed on the bottom surface of the metal body so that leads 210 are inserted therein, and bonding holes 140 formed to communicate with the lead insertion recesses 150 and passing through the cavity 110; and leads 210 seated into the lead insertion recesses 150 of the metal body 100 and insulation bonded to the bottom surface of the metal body 100 by means of an insulating binder A.

Also, the LED package may further include an LED 300 which is bonded to the cavity 110 of the metal body 100 and wire bonded to the leads 210 exposed via the bonding holes 140 thus forming an electrical connection therebetween, and a lens 400 which is mounted on the lens mount 120 of the metal body 100 thus hermetically sealing the cavity 110. For example, the LED 300 may be bonded to the cavity 110 using an epoxy resin (herein, the LED 300 indicates an LED chip).

According to a preferred embodiment, silver (Ag) electroplating may be performed, and thereby, upon wire bonding between the LED 300 and the leads 210, bonding may be more efficiently achieved and electrical conductivity may be increased. Also, the metal body 100 may reflect light emitted from the LED 300, thus increasing light emission efficiency. As such, plating may be performed using platinum or gold instead of silver. Furthermore, nickel plating may be performed before silver electroplating, thereby increasing corrosion resistance and heat resistance. Also, when the leads 210 and the metal body 100, which are insulation bonded to each other, are electroplated, a plating layer is not formed at the insulation bonded portion therebetween, so that an insulation type bonding relationship between the leads 210 and the metal body 100 may be maintained.

The metal body 100 is formed of a metal or an alloy thereof having high heat conductivity and heat dissipation efficiency, for example, any one metal or an alloy thereof selected from among copper (397 W/mK) and aluminum (230 W/mK). Particularly useful is copper or an alloy thereof which is industrially available and inexpensive and has high heat conductivity.

The lens mount 120 of the metal body 100 is located to the top of the metal body 100, so that a lens is mounted on the lens mount 120 by engagement with the inner surface of the lens mount 120 disposed around the cavity 110. As such, the lens 400 is formed of a typical material able to transmit light emitted from the LED 300, and may adopt a variety of shapes in order to control the view angle of light.

The heat sink 130 of the metal body 100 is formed on the outer surface of the metal body 100 in order to dissipate heat generated from the LED 300, and includes a plurality of heat dissipation fins 132 to increase the contact area with the external air, so that the heat exchange area is enlarged, thus increasing heat exchange efficiency.

The bonding holes 140 of the metal body 100 are formed so as to electrically connect the LED 300 and the leads 210 of the lead frame 200 to each other. The number of bonding holes 140 is determined by the number of LEDs 300 received in the metal body 100. Typically, the number of LEDs 300 received in the metal body 100 is set to 1~3 (but the present invention is not limited thereto). As such, two bonding holes 140, that is, a pair of bonding holes 140, are required per LED 300. Furthermore, the number of bonding holes 140 corresponds to the number of leads 210 of the lead frame 200.

As such, the upper portions of the bonding holes 140 of the metal body 100 are formed to be inclined so as to prevent the wiring 310 from making contact upon wire bonding.

According to a preferred embodiment, the wire bonded portion between the LED 300 and the leads 210 may be molded with an insulating material C (e.g. silicon). In particular, the LED 300 may be further molded with an insulating material D containing a phosphor (e.g. a mixture of silicon and phosphor). The molding process may be performed only on the corresponding portion, or alternatively, as shown in FIG. 6, the entire cavity 110 including the LED and the wire bonded portion may be molded. Thereby, the insulation relationship between the wiring 310 and the metal body 100 may be maintained, and also, the LED 300 may be controlled so as to emit light having a predetermined color due to the use of the phosphor. The technique related to the phosphor is known and the description thereof is omitted.

The lead insertion recesses 150 of the metal body 100 are formed on the bottom surface of the metal body 100 as shown in the drawing, and are formed to be larger than the size of the leads 210 inserted into the recesses.

Furthermore, holding holes 160 into which holding pins 230 of the lead frame 200 are inserted may be additionally formed on the bottom surface of the metal body 100. As such, the lead frame 200 should further include the holding pins 230 which are fitted into the holding holes 160 of the metal body 100. Thereby, insulation bonding may become possible at predetermined positions as shown in FIG. 4.

The lead frame 200 functions to electrically connect the LED 300 received in the metal body 100 to the outside, and may be formed of an electrically conductive material. Typically, the lead frame 200 may be made of any one selected from the metal or metal group, including pure copper, a copper alloy, an iron alloy, a nickel-iron alloy, an Invar alloy, and a Kovar alloy.

The leads 210 of the lead frame 200 are received in the lead insertion recesses 150 of the metal body 100 and are thus insulation bonded with the lead insertion recesses 150 of the metal body 100. To this end, a typical insulating binder A is used. The insulating binder A is selected from the group consisting of glass which is electrically non-conductive and insulating polymers.

The lead frame 200 may be subjected to nickel plating in order to increase corrosion resistance and heat resistance before insulation bonding with the metal body 100, thereby preventing the oxidation thereof upon subsequent silver plating. Alternatively, gold, platinum or silver plating may be performed in order to increase electrical conductivity. As such, the plating process may be carried out using a typically known method.

The holding pins 230 of the lead frame 200 are fitted into the holding holes 160 of the metal body 100, and then may be removed while cutting the portions other than the leads of the lead frame 200 during the treatment of the LED package. FIG. 3 illustrates one holding pin 230 fitted into either of two holding holes 160 of the metal body 100. Alternatively, two holding pins 230 may be respectively fitted into two holding holes 160 of the metal body 100. That is, the number of holding pins 230 or holding holes 160 is not particularly limited.

In addition, according to a preferred embodiment, the leads 210 include protrusions 215 which are inserted into the bonding holes 140 of the metal body 100, and may further include insulating members B which are provided around the protrusions 215 of the leads 210 and inserted into the bonding holes 140 of the metal body 100, so that the protrusions 215 of the leads 210 are fusion bonded to the metal body 100 by means of the insulation members B, and the LED 300 may be wire bonded to the protrusions 215 so as to form an electrical connection therebetween. As such, the insulating members B are made of a material selected from among glass which is electrically non-conductive and insulating polymers. In particular, the insulating members B should be formed of a material having a melting point lower than that of the material used to plate the metal body 100 and the lead frame 200. Thereby, a more stable insulation type bonding relationship between the lead frame 200 and the metal body 100 may be achieved.

Figure 7:
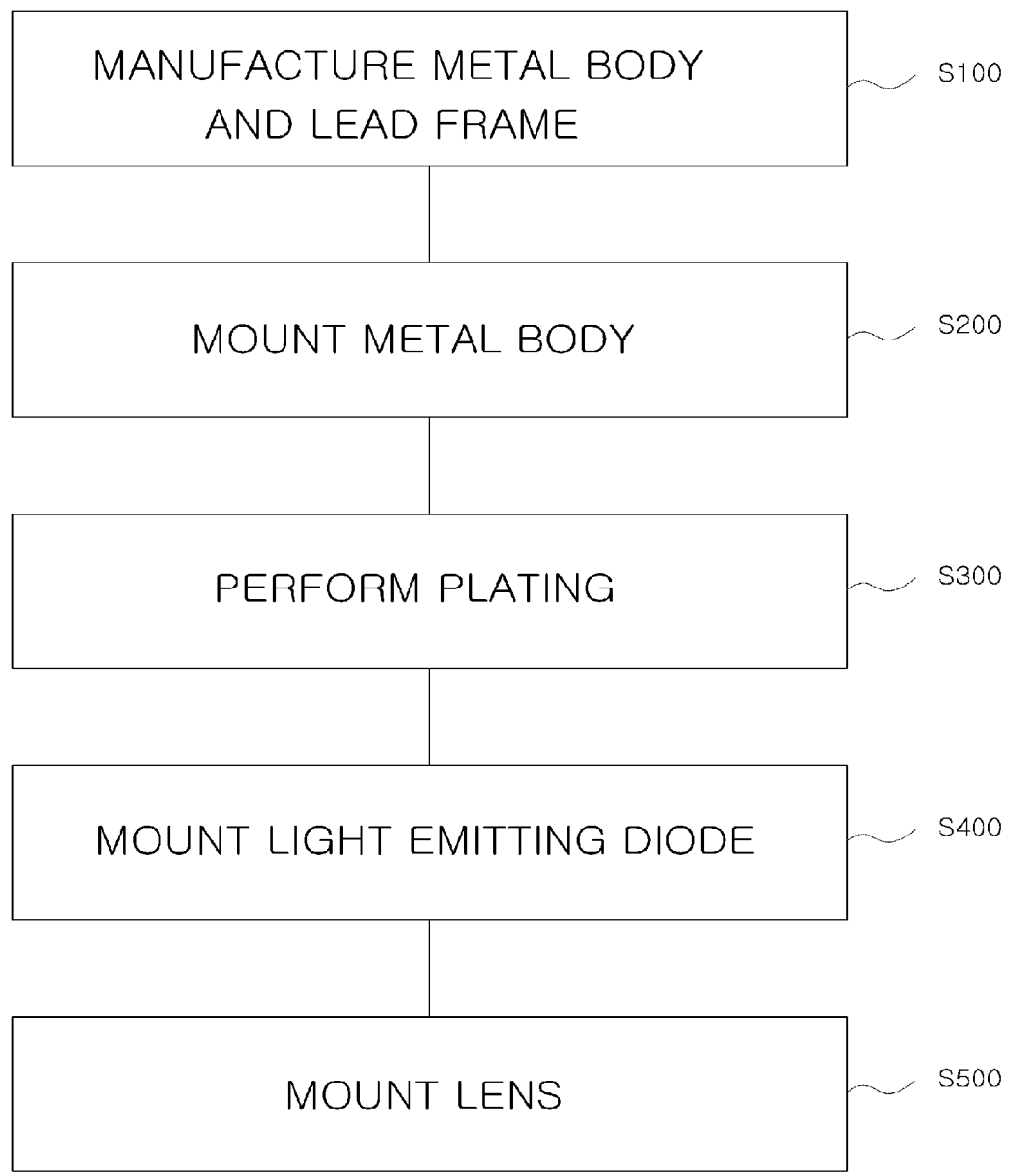
FIG. 7 is a flowchart showing a process of manufacturing the LED package according to the embodiment of the present invention.

FIG. 7 is a flowchart showing a process of manufacturing the LED package according to the embodiment of the present invention. The method of manufacturing the LED package according to the present invention includes manufacturing a metal body 100 composed of a cavity 110 for receiving an LED 300 therein, a lens mount 120 for mounting thereon a lens 400 through which light is transmitted, a heat sink 130 for dissipating heat, lead insertion recesses 150 formed on the bottom surface of the metal body so that leads 210 are inserted therein, and bonding holes 140 formed to communicate with the lead insertion recesses 150 and passing through the cavity 110, and manufacturing a lead frame 200 including leads 210 seated into the lead insertion recesses 150 of the metal body 100 and insulation bonded to the bottom surface of the metal body 100 by means of an insulating binder A (S100); insulation bonding the leads 210 of the lead frame 200 to the lead insertion recesses 150 of the metal body 100 by means of the insulating binder A thus mounting the metal body 100 to the lead frame 200 (S200); and electroplating the lead frame 200 and the metal body 100 which are insulation bonded to each other (S300).

According to a preferred embodiment, in S300, electroplating may be performed using silver (Ag). Thereby, upon wire bonding between the LED 300 and the leads 210, bonding may be more efficiently achieved and electrical conductivity may be increased. Furthermore, the metal body 100 may reflect light emitted from the LED 300, thus increasing light emission efficiency. As such, plating may be performed using platinum or gold instead of silver. Also, before silver electroplating, nickel plating may be performed thus increasing corrosion resistance and heat resistance. Also, when the leads 210 and the metal body 100 which are insulation bonded to each other are electroplated, a plating layer is not formed at the insulation bonded portion therebetween, so that the insulation type bonding relationship between the leads 210 and the metal body 100 is maintained.

Also, S300 may further include inspecting defects of an outer appearance of the plated LED package.

In addition, the method of manufacturing the LED package according to the present invention may further include, after S300, bonding the LED 300 to the cavity 110 of the metal body 100 and wire bonding the LED 300 to the leads 210 via the bonding holes 140 so as to form an electrical connection therebetween, thus mounting the LED 300 (S400); and mounting the lens 400 to the lens mount 120 of the metal body 100 so as to hermetically seal the cavity 110 (S500).

As such, between S400 and S500, molding the wire bonded portion between the LED 300 and the leads 210 with an insulating material C may be further performed. This molding process may further include molding the LED 300 with an insulating material D containing a phosphor.

According to the present invention, in the LED package, the lead insertion recesses 150 of the metal body 100 and the leads 210 of the lead frame 200 may be bonded using the insulating binder, so that an insulation type bonding relationship therebetween is maintained stable. The metal body 100 which is a housing receiving the LED 300 is made of a metal and thus heat generated from the LED 300 may be easily dissipated to the outside, and the metal body 100 receiving the LED 300 is plated with a material able to reflect light, thus increasing light emission efficiency.

Moreover, the LED package including the leads 210 and the metal body 100 which are bonded to each other may be used as a package of a semiconductor chip in lieu of the LED.

As described hereinbefore, the present invention provides an LED package and a method of manufacturing the same. According to the present invention, the LED package is configured such that a lead insertion recess of a metal body and a lead of a lead frame are bonded to each other using an insulating binder, so that an insulation type bonding relationship therebetween is maintained stable. Furthermore, the metal body which is a housing receiving an LED is made of a metal and thus heat generated from the LED may be easily dissipated to the outside, and also, the metal body receiving the LED is plated with a material able to reflect light thus increasing light emission efficiency.

Although the embodiments of the present invention have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A method of manufacturing a light emitting diode package, comprising:

manufacturing a metal body comprising a cavity for receiving a light emitting diode therein, a lens mount for mounting thereon a lens through which light is transmitted, a heat sink for dissipating heat, a lead insertion recess formed on a bottom surface of the metal body so that a lead is inserted therein, and a bonding hole formed to communicate with the lead insertion recess and passing through the cavity of the metal body, and manufacturing a lead frame comprising a lead seated into the lead insertion recess of the metal body and insulation bonded to the bottom surface of the metal body by means of an insulating binder;

insulation bonding the lead of the lead frame to the lead insertion recess of the metal body by means of the insulating binder, thus mounting the metal body to the lead frame; and electroplating the lead frame and the metal body which are insulation bonded to each other.

2. The method as set forth in claim 1, further comprising, after electroplating, bonding the light emitting diode to the cavity of the metal body and wire bonding the light emitting diode to the lead via the bonding hole so as to form an electrical connection therebetween, thus mounting the light emitting diode; and mounting the lens on the lens mount of the metal body so as to hermetically seal the cavity of the metal body.

3. The method as set forth in claim 2, further comprising molding a wire bonded portion between the light emitting diode and the lead using an insulating material, between mounting the light emitting diode and mounting the lens.

4. The method as set forth in claim 3, wherein the molding further comprises molding the light emitting diode using an insulating material containing a phosphor.

* * * * *